United States Patent
Krajecki (10) Patent No.: US 6,944,011 B2
(45) Date of Patent: Sep. 13, 2005

(54) ELECTRONIC DEVICE CABLE COVER (76) Inventor: Gary T. Krajecki, 6 Devonshire Cir., Elgin, IL (US) 60123

(*) Notice: Subject to any disclaimer, the term of this patent is extended or adjusted under 35 U.S.C. 154(b) by 0 days.

(21) Appl. No.: 10/733,054

(22) Filed: Dec. 11, 2003

(65) Prior Publication Data
US 2004/0252448 A1 Dec. 16, 2004

Related U.S. Application Data
(60) Provisional application No. 60/477,895, filed on Jun. 13, 2003.

(51) Int. Cl.[7] .................................................. H05K 5/00
(52) U.S. Cl. ...................... 361/679; 361/724; 312/223.2; 211/126.15
(58) Field of Search ........................ 361/679, 724–725; 312/223.2–223.3; 211/126.15

(56) References Cited

U.S. PATENT DOCUMENTS

| | | | |
|---|---|---|---|
| 1,794,667 A | 3/1931 | Blake | |
| 2,957,740 A | 10/1960 | Lewis | 312/245 |
| 3,062,917 A | 11/1962 | Rose | 178/7.91 |
| 3,329,770 A | 7/1967 | Rose | 178/7.9 |
| 3,635,174 A | 1/1972 | Ball et al. | 108/150 |
| 3,930,701 A | 1/1976 | Otakie | 312/244 |
| 4,624,510 A * | 11/1986 | Jedziniak | 312/223.3 |
| 5,195,022 A * | 3/1993 | Hoppal et al. | 361/685 |
| 5,417,012 A * | 5/1995 | Brightman et al. | 49/382 |
| 5,491,611 A | 2/1996 | Stewart et al. | 361/736 |
| 5,781,408 A * | 7/1998 | Crane et al. | 361/683 |
| 6,074,028 A | 6/2000 | Ho | 312/223.2 |
| 6,209,974 B1 | 4/2001 | Goto et al. | 312/7.2 |
| 6,364,128 B1 | 4/2002 | Wohlford | 211/26 |
| 6,389,988 B1 | 5/2002 | Frattini | 108/50.02 |
| 6,505,898 B1 | 1/2003 | Buchanan et al. | 312/7.2 |
| 2002/0084727 A1 | 7/2002 | Miller | 312/205 |
| 2002/0096979 A1 | 7/2002 | Johnson | 312/205 |

FOREIGN PATENT DOCUMENTS

| | | | | |
|---|---|---|---|---|
| EP | 0 594 287 A2 | 8/1993 | | A47B/21/00 |
| GB | 2 279 002 A | 11/1993 | | A47B/21/00 |
| WO | 03/043396 A1 | 5/2003 | | H05K/7/00 |

* cited by examiner

*Primary Examiner*—Yean-Hsi Chang
(74) *Attorney, Agent, or Firm*—Conley Rose, P.C.; Michael W. Piper; Albert C. Metrailer (57) ABSTRACT

The present disclosure addresses a cover for cables extending from an electronic device. The cover may be a one-piece cover having a horizontal top and vertical sides. The top has a width dimension corresponding to the width of an electronic device and the sides have a height dimension corresponding to the height of the electronic device. When positioned adjacent the back of an electronic device, the cover has the appearance of an extension of the device and blocks the view of and access to cables. The cover may be positioned on a supporting surface on which an electronic device is supported. The cover may be sized to slidably fit onto an electronic device and be attached to the device at the factory. The cover may be transported to the user's location as a flat sheet of metal and formed into a cable cover by the user.

19 Claims, 6 Drawing Sheets

ELECTRONIC DEVICE CABLE COVER

CROSS-REFERENCE TO RELATED APPLICATIONS

This application claims priority from U.S. Provisional Patent Application Ser. No. 60/477,895, entitled "Electronic Device Wire Cover", filed on Jun. 13, 2003, which is hereby incorporated for all purposes.

STATEMENT REGARDING FEDERALLY SPONSORED RESEARCH OR DEVELOPMENT

Not applicable.

REFERENCE TO A MICROFICHE APPENDIX

Not applicable.

FIELD OF THE INVENTION

The present invention relates to electronic devices connected by cables and more particularly to an apparatus and method for covering the cables connecting the devices.

BACKGROUND OF THE INVENTION

Modern audio video systems generally have a number of individual electronic devices including, for example, a receiver, a VCR, a CD player, a DVD player, a cable or satellite decoder, a video game console, etc. A receiver normally includes radio tuners for AM and FM radio signals as well as an audio amplifier. Receivers also usually include connections to couple audio, video, and data signals to and from other devices, e.g. a VCR, a CD player, a game console, and a DVD player, including connections to a television video display and to a set of speakers.

The audio video system devices need to be physically close to each other, since they must be interconnected by various cables to operate properly. Various entertainment center structures, e.g. cabinets, shelves, etc., have been developed for housing the devices in such a way that they may be conveniently interconnected and the controls may be easily accessed. These structures typically comprise a vertically stacked set of shelves providing spaces for each device. Controls on the front of each device may be accessed from the front. The cable connections are normally on the back surface of the devices. The structures often include vertical raceways or conduits on the back through which the cables may be routed up and down as needed to make the necessary connections. The structures are often open on the sides as well as the front to provide easy access for making the cable connections.

This common entertainment center arrangement results in a visual appearance which many people dislike. The multiple cables interconnecting the various devices are exposed to view and may be described by many people as a tangled mess. They collect dust and are difficult to clean. The cables may be easily accessed by small children. The electronic devices themselves have a variety of sizes and usually do not have an organized appearance when stacked in an entertainment center.

SUMMARY OF THE INVENTION

An embodiment of the present invention provides a one-piece cover having a cross sectional shape corresponding to the back surface of an electronic device and having a length dimension sufficient to cover wires and cables connected to the back of the electronic device. When positioned adjacent the back of an electronic device, the cover has the appearance of an extension of the device and blocks the view of, and restricts access to, cables attached to the device.

An embodiment of the present invention for use with devices having a conventional rectangular shape provides a one-piece cover having a horizontal top and vertical sides. The top has a width dimension corresponding to the width of an electronic device and the sides have a height dimension corresponding to the height of the electronic device. When positioned adjacent the back of an electronic device, the cover has the appearance of an extension of the device and blocks the view of, and restricts access to, cables attached to the device.

In one embodiment, the cover is positioned on a supporting surface on which an electronic device is supported. The cover is positioned adjacent the back of the device to form a wire routing space enclosed on five sides.

In one embodiment, the cover is sized to slidably fit onto an electronic device and is attached to the device at the factory. After delivery, the cover is slid partially off the back of the device to cover connecting cables.

In another embodiment, the cover is transported to the user's location as a flat sheet of metal and formed into a cable cover by the user.

DETAILED DESCRIPTION OF THE PREFERRED EMBODIMENTS

In describing the present invention, positional terms such as top, bottom, above, below, vertical, and horizontal are used with reference to the orientation of an electronic device in its normal operating position. A cable cover according to the invention and an electronic device may of course be rotated into other positions while being made, handled and assembled, and may in some cases be supported on surfaces which are not horizontal. The term cable is used to include any signal carrying media used to couple audio signals, video signals, data signals and/or power to and between electronic devices including coaxial cables, multiconductor cables, fiber optical cables, and the like, often commonly referred to as wires.

Figure 1:
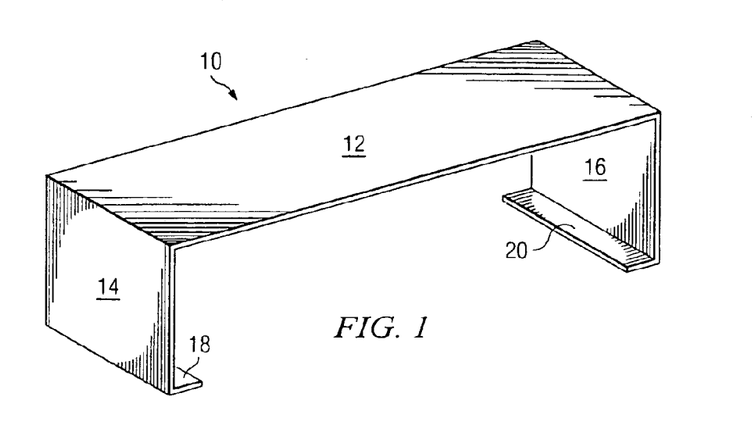
FIG. 1 is a perspective view of a cable cover according to one embodiment of the invention.
Figure 2:
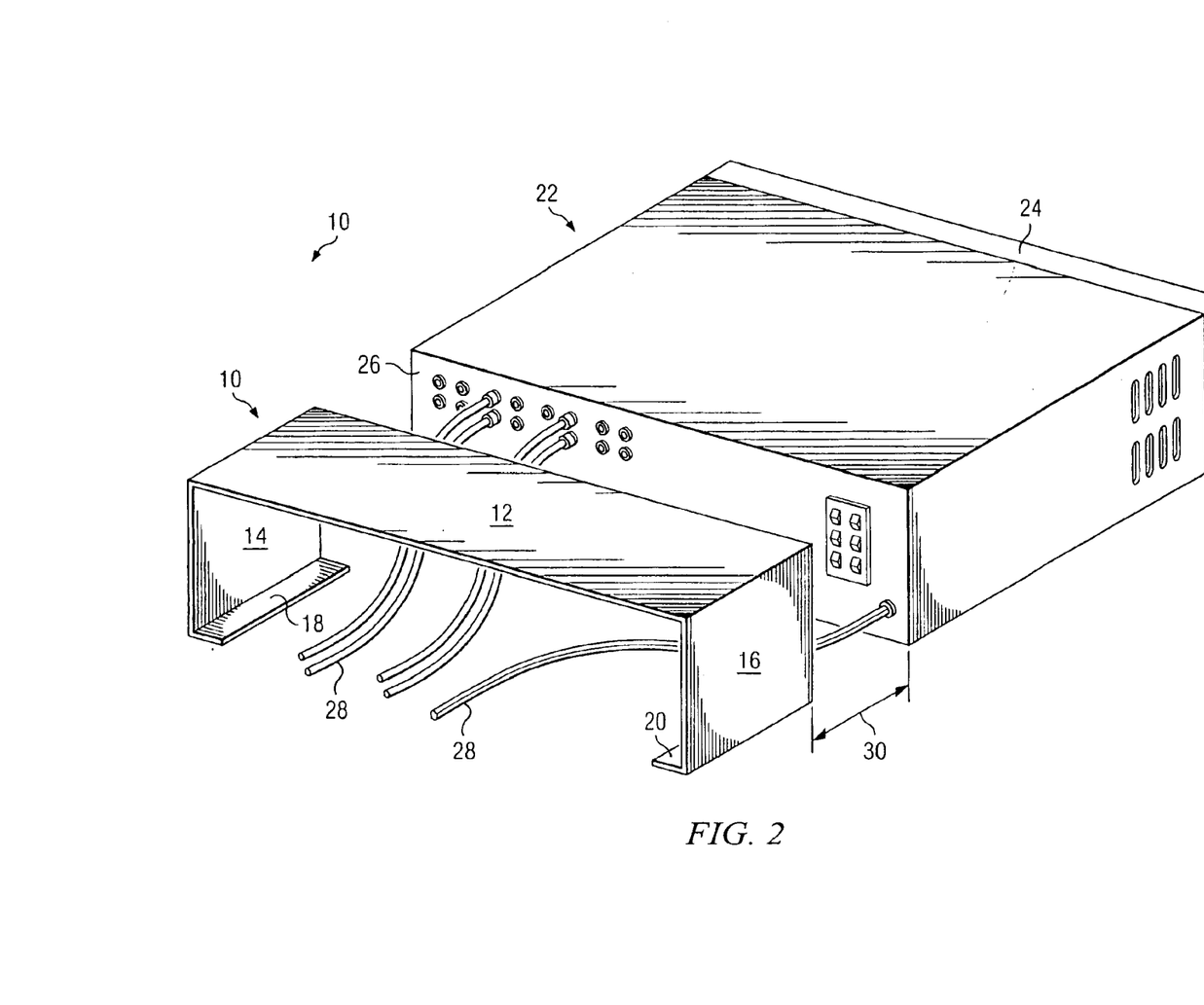
FIG. 2 is a perspective view of the cable cover of FIG. 1 assembled with an electronic device.

FIGS. 1 and 2 illustrate one embodiment of a cable cover 10 according to the invention for use with devices having a conventional rectangular shape. The cover 10 includes a rectangular horizontal flat top 12 and connecting rectangular vertical sides 14 and 16. In this embodiment, flanges 18 and 20 extend horizontally from the bottom edges of sides 14 and 16 and lie below and parallel to the top 12. The cover 10 may be made from a single rectangular piece of bendable material as described below. If desired, the cover 10 could be molded or shaped from plastic, metal or other material into the illustrated form.

FIG. 2 illustrates the cover 10 positioned near the back of an electronic device 22, for example, a receiver. The device 22 has a front 24 containing controls and a back surface 26 having a number of cable connections, which may be referred to as sockets, jacks, outlets, etc., to which a number of cables 28 are connected. Although not shown, it is understood that the cables 28 extend to other devices or to power sources. In FIG. 2, the cable cover 10 is shown spaced from the back 26 of device 22 by a distance 30 so that the back 26 can be better illustrated. In normal use, the cover 10 may be positioned as close as possible to and preferably in contact with the device 22.

When the cable cover 10 is positioned against the back of the device 22 and the cover 10 and device 22 are supported on a flat surface, the cable cover 10 defines or encloses a protected cavity or chamber through which the cables 28 pass. The cable cover 10 itself encloses three sides of the chamber, i.e. the top and sides. The back 26 of the device 22 encloses the front of the chamber. A supporting surface and the flanges 18 and 20, if used, enclose the bottom of the chamber. The chamber is thus enclosed on five sides and open only at the back. The depth of the chamber, i.e. the distance from front to back, is determined by either the depth of the cable cover 10, or for slide-on embodiments discussed below, the depth of the part of cable cover 10 which is extended behind the device 22. The depth is selected to achieve two functions. One function is to change the appearance of an electronic device, generally by making it appear to have a greater depth than it actually has. Another function is to block the view of and prevent direct access to the cables 28 by providing a protected chamber for the cables. The cables 28 all have some type of plug or connector by which they are connected to the connections on the back surface 26 of the device 22. It is desirable that the device cover 10 extend from the back of device 22 by a sufficient distance to at least block the view of and access to such plugs or connectors, many of which are at least one inch long.

The flanges 18 and 20 are not essential to either of the functions discussed above. The flanges 18 and 20 mechanically stiffen the sides 14 and 16 and may function as supporting feet for the cover 10. They are also a natural byproduct of the process for making a cable cover as described below with reference to FIGS. 5, 6 and 7.

Figure 3:
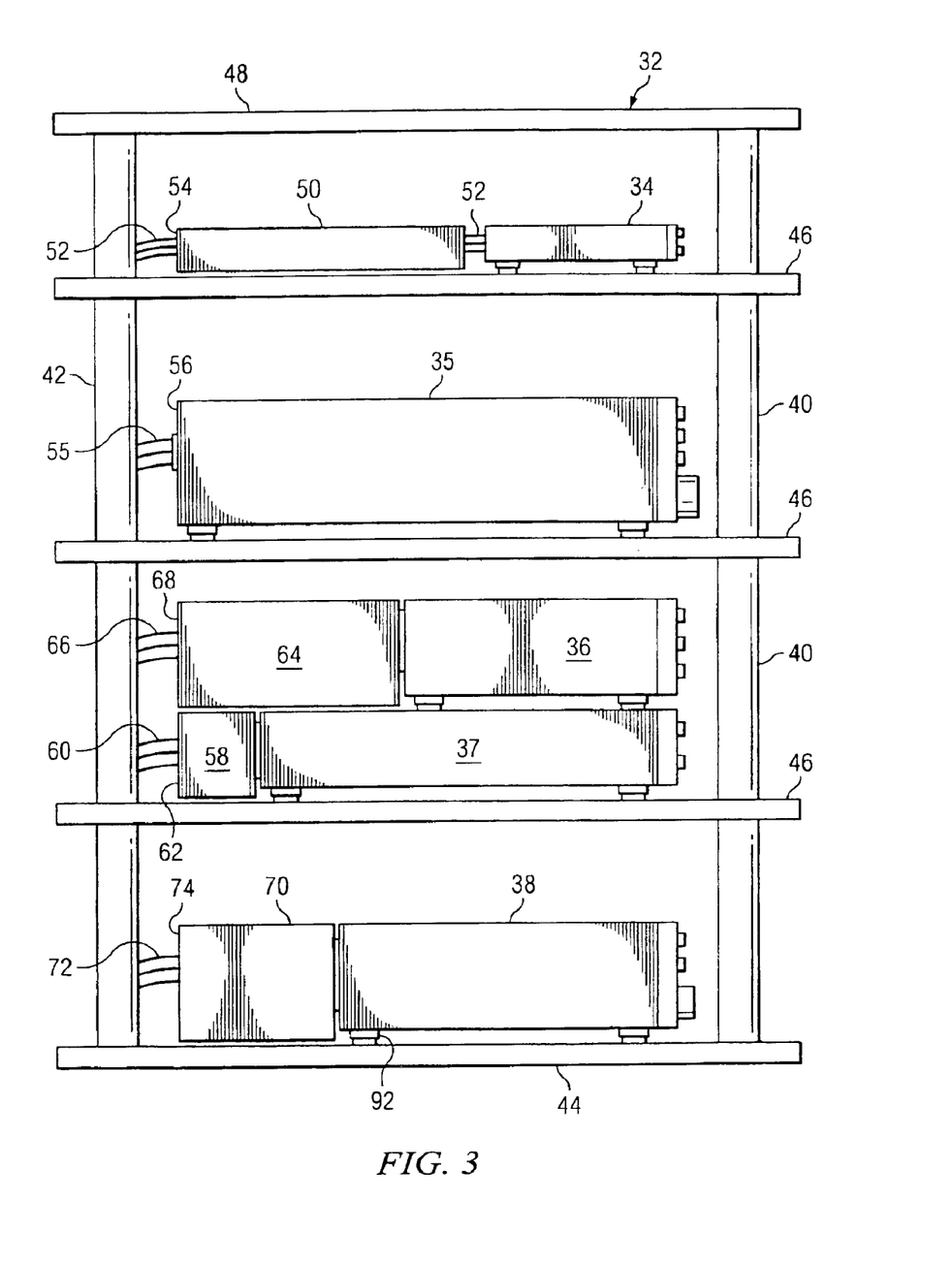
FIG. 3 is a side view of an entertainment center with a number of electronic devices and cable covers according to the invention.

FIG. 3 illustrates a side view of various embodiments of the present invention in use in a typical entertainment center. An open shelf type of entertainment center cabinet 32 is used to support a number of electronic devices 34, 35, 36, 37 and 38. The cabinet 32 may include supporting posts 40 on its front corners and a hollow support column 42 on its back. A solid base 44 may be adapted to sit on a floor and to support the supports 40 and 42. In this embodiment, three shelves 46 are supported by the supports 40 and 42. Shelves 46 may typically be transparent, e.g. made of glass. A cabinet top 48 may be made of a solid opaque material, e.g. wood, like the base 44. The hollow support column 42 may typically provide a conduit or raceway for routing cables between the devices 34–38.

Device 34 is illustrated as being relatively small in its height and depth dimensions. Device 34 may be for example, a satellite dish receiver box. A cable cover 50 according to the present invention is positioned on the top shelf 46 behind device 34 and extending to near the back edge of the top shelf 46. In this illustration, a small space is shown between device 34 and cable cover 50 to show that cables 52 extend from the back of device 34, through the cover 50 and into the vertical raceway 42. In use, it is preferred to slide the cover 50 forward into contact with the back of device 34 or partially over the device 34.

Device 35 is shown supported on the middle shelf 46 and as being the largest of the devices 34–38. Device 35 may be, for example, the main system receiver/amplifier. In this example, the depth dimension of device 35 is large enough to extend to near the back edge of the shelves 46, i.e. essentially all the way to the rear support and cable raceway 42. Cables 55 extending from the back of device 35 are exposed for only a short distance, so there is little need to provide a cable cover to block the view of them or to limit access to them. Since the device 35 itself extends essentially all the way to the back of the middle shelf 46, there is little need to use a cable cover to give the appearance of device 35 extending to the back of the shelf. In this embodiment, the back edge 56 of the device 35 provides the depth location to which the back edges of other devices may be aligned for a uniform appearance. For example, the cable cover 50 on the top shelf 46 may be sized and positioned so that its back edge 54 is generally aligned with the back edge 56 of the device 35. If the depth dimension of device 35 was less and the cables 55 were more exposed, it would be desirable to use a cable cover according to the invention behind the device 35.

The devices 36 and 37 are both supported by the bottom shelf 46, with device 36 positioned on the top of device 37. Stacking of devices in this way is typical in entertainment centers. As illustrated, the device 37 has a greater depth than device 36, so that the weight of device 36 is fully supported by the top surface of device 37. Device 37 is shown as having a depth greater than device 34, but less than device 35. A relatively short cable cover 58 is positioned behind the device 37 to cover its cables 60 and positioned its back edge in alignment with the back 54 of cover 50 and the back edge 56 of device 35. Since device 36 has less depth than device 37, it requires a cable cover 64 having greater depth than cover 58. The cover 64 is sized and positioned so that its back edge 68 is aligned with the back edges 54, 62 of covers 50, 58 and with the back edge 56 of device 35. The cover 64 is supported partially by the top surface of the device 37 and partially by the top surface of the cable cover 58.

The electronic device 38 is shown supported on the base 44 of the cabinet 32. A cable cover 70 is positioned behind device 38 and also supported by the base 44. The cover 70 is sized and positioned to cover cables 72 extending to and from the back of device 38. The back edge 74 is preferably aligned with the back edges 54, 62, 68 of covers 50, 58, 64 and with the back edge 56 of device 35.

All of the cable covers 50, 58, 64 and 70 shown in FIG. 3 share common features. Each cover 50, 58, 64 and 70 has a depth dimension selected so that when positioned behind its respective electronic device 34, 37, 36, and 38, it provides the appearance of a device having the same depth as the device 35. Each cover 50, 58, 64 and 70 has a height dimension about equal to its respective electronic device 34, 37, 36, and 38. Each cover 50, 58, 64, 70 blocks the view of, and limits access to, the cables extending between its respective electronic device 34, 37, 36, and 38 and the cable raceway 42.

Figure 4:
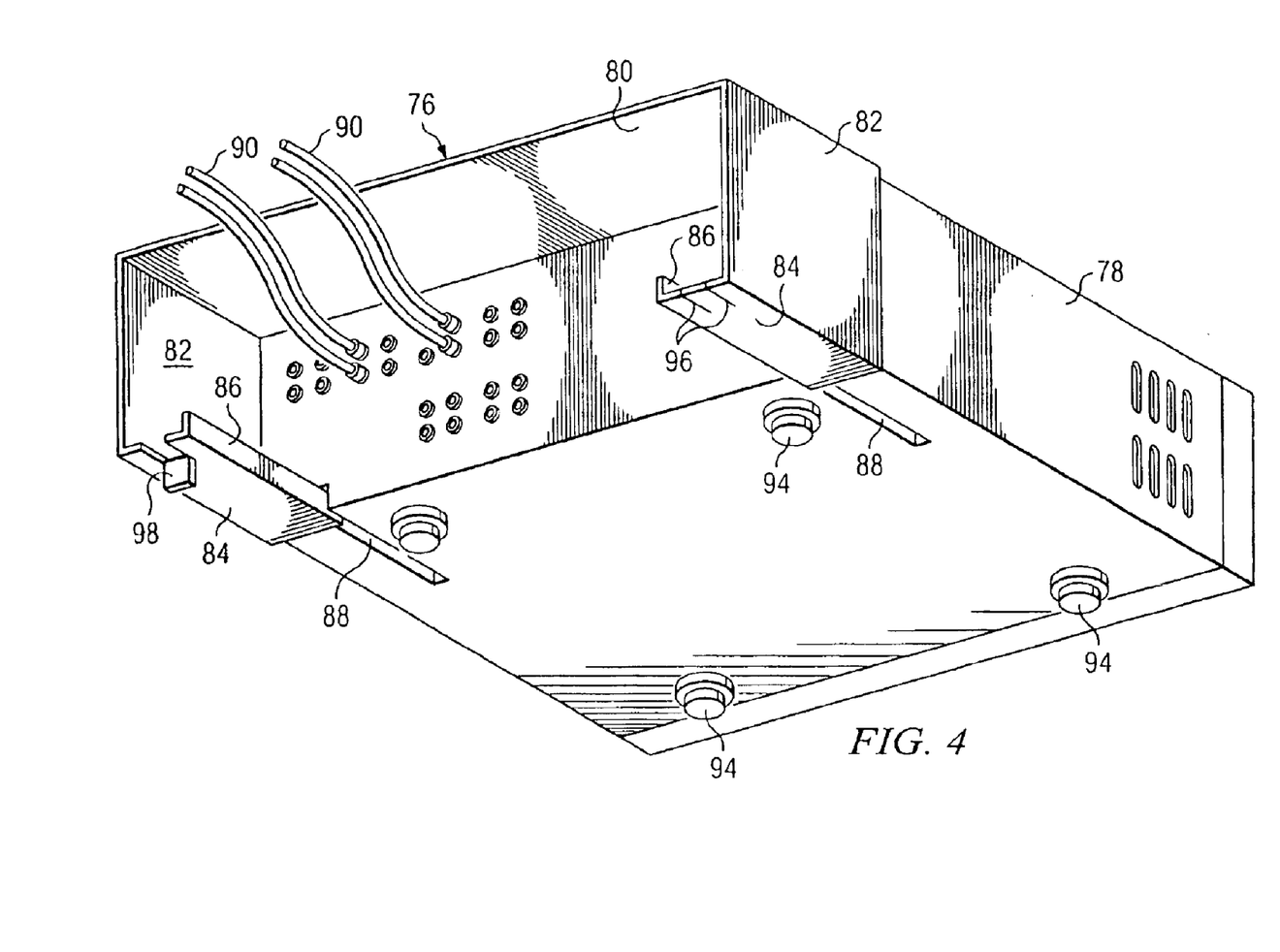
FIG. 4 is a perspective view of a cable cover of the invention slidably attached to an electronic device.

FIG. 4 illustrates an alternative embodiment of a cable cover 76 which may be delivered to a consumer as part of an electronic device 78. Like the cable cover 10 of FIG. 1, the cable cover 76 has a rectangular horizontal top portion 80, two vertical rectangular sides 82, and flanges 84 extending inwardly from the lower edges of the sides 82. One edge of each of the flanges 84 is connected to the bottom edges of the sides 82. On the opposite edge of each flange 84 may be an upturned flange 86. On the bottom of the electronic device 78 may be provided two grooves or slots 88, sized and positioned to slidably receive the upturned flanges 86. The inside width and height dimensions of the cable cover 76 are selected to be slightly larger than the outside width and height dimensions of the electronic device 78. The cable cover 76 may therefore be slid completely onto the device 78 at the factory and shipped with the device 78 to the ultimate user. When the device 78 has been installed, e.g. in the entertainment unit 32 of FIG. 3, and cables 90 have been connected and routed, the cable cover may be slid partially or entirely off of the device 78 to a position such as those shown in FIGS. 2 and 3.

The FIG. 4 embodiment differs slightly from the embodiments shown in FIGS. 2 and 3. In FIG. 3, the height of cable cover 70 is about equal to the height of device 38 including feet 92 normally provided under the device 38. The cover 70 does not have separate feet and rests directly on the base 44. This arrangement places the top of cable cover 70 in alignment with the top of device 38 and provides a pleasing appearance.

In the FIG. 4 embodiment, the sides 82 of cable cover 76 have a height about equal to the height of the device 78, not including the height of feet 94. This sizing provides for a snug telescoping fit of the cover 76 to the device 78. However, when the device 78 is placed on a flat supporting surface and the cover 76 is extended, the cover 76 will be positioned above the supporting surface and not directly supported by it. It may be desirable to provide some type of supporting feet under at least the rearmost edge of the cover 76 to prevent sagging. In the FIG. 4 embodiment, supporting feet are provided by cutting two slots 96 in each of the flanges 84. The slots 96 produce tabs 98, which may be bent downwardly, as shown on the left side of FIG. 4, to provide supporting feet. The tabs 98 may be left in their unbent position during delivery of the device 78 to the consumer to avoid damage during shipping and handling. The consumer may bend the tabs 98 into their final position while installing the device 78. Alternatively, an additional pair of feet, like feet 94, may be attached to the cable cover 76.

The cable cover 76 of the FIG. 4 embodiment may be made at a factory using industrial equipment. It may be made by cutting and shaping a flexible material such as sheet aluminum or it may be cast or formed from plastic or other materials as discussed above. It may be attached to and shipped with the device 78, with minimal change in size or weight of the product and with little chance of being damaged in shipment. The cable cover 76 does not replace any part of the conventional housing forming part of device 78. If the cover 76 is slid completely off the device 78, its internal circuitry will still be fully enclosed and protected by the conventional housing. The cover 76 is intended to provide a protected chamber or cavity behind the device 78, but is not intended to provide protection for the device 78 itself.

It may not be desirable to make the cable cover 10 of FIG. 1 at a factory and ship it to a retail store or to a consumer. The cover 10 is relatively light and fragile. Since it comprises mostly empty space, the cost of protective packaging and shipping may be prohibitive in terms of the shipping cost per pound or as compared to the cost to make the cable cover and a reasonable selling price. In one embodiment, cable covers according to the present invention are shipped as kits with which the ultimate consumer may make cable covers for electronic devices. The kits may comprise bendable rectangular sheets of metal, preferably aluminum, with instructions on how to bend the sheets into properly dimensioned cable covers. Most current electronic devices have black or silver colored housings. In one embodiment, the sheets of metal may be finished in black on one side and silver on the other, so that they may be used with either color device. It is also desirable to provide peel off plastic, e.g. PVC or polyethylene, coatings on the finished metal sheets to prevent damage to the finish during shipping and handling. The rectangular sheets may be provided in a small number of widths, for example three, five and one-half, and eight inches, corresponding to common depths of cable covers. They may also be provided with other finish colors selected to match or complement the colors of available electronic devices.

Figure 5:
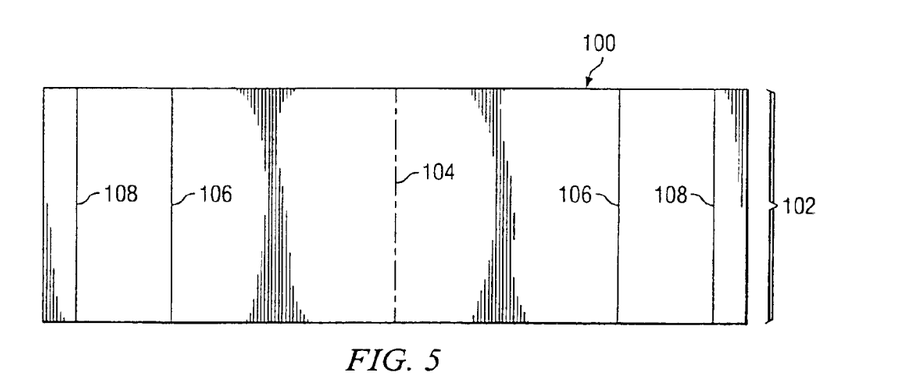
FIGS. 5, 6 and 7 illustrate steps in a process for forming a cable cover from a flat sheet of material.
Figure 6:
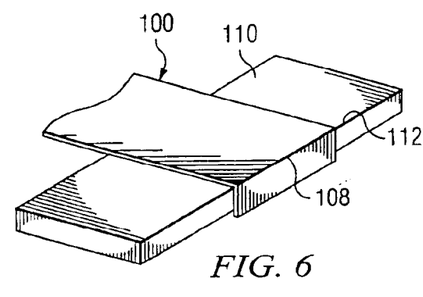
Figure 7:
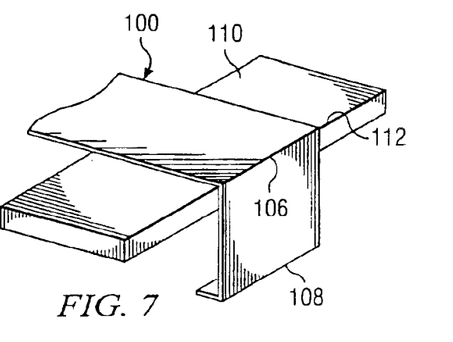

FIGS. 5, 6 and 7 illustrate some of the steps which may be used to form a finished cable cover 10 of FIG. 1 from a rectangular sheet of metal, e.g. aluminum, 100 (FIG. 5). The sheet 100 should be selected to have a desired dimension 102 which will be the final depth dimension of a finished cable cover 10. The sheet 100 should be turned so that the desired color is facing up. The height and width of an electronic device are then measured. For a cover according to FIGS. 1 and 2, the height is the distance from a supporting surface to the top of the device, i.e. it includes any feet under the device. A center mark 104 is then made across the middle of the sheet 100. The measured width of the device is then divided by two and two marks 106 are made across the sheet 100 spaced from the center mark 104 by this distance. Two more marks 108 are made across the sheet 100 spaced outside of the marks 106 by the measured height of the device.

After the sheet 100 has been marked as shown in FIG. 5, it may be formed by the steps shown in FIGS. 6 and 7. In FIG. 6, the sheet 100 is placed on a flat surface 110 having a relatively square edge 112, and the mark 108 is aligned with the edge 112. A hardcover book or a block of wood may then be used to bend the sheet 100 over the edge 112. In FIG. 7, the sheet 100 is moved so that the mark 106 is aligned with the edge 112. A book or block of wood is again used to bend the sheet 100 over the edge 112. The process of FIGS. 6 and 7 is repeated for the opposite end of the sheet 100. If the bends are not exactly ninety-degree bends after this process, they may be adjusted by hand. If the sheet 100 has a protective plastic film, it may be removed after the sheet has been formed into the cable cover 10. The cover 10 may then be positioned next to an electronic device as shown in FIGS. 2 and 3.

It may be desirable for the FIG. 1 embodiment to telescopically fit an electronic device somewhat like the FIG. 4 embodiment. In this embodiment, it is presumed that an electronic device was not specifically designed for mating with a cable cover, as was the device 78 of FIG. 4. In the process described with reference to FIGS. 5, 6 and 7, the measured height dimension may be increased by about the thickness of the sheet 100 and the measured width dimension may be increased by about twice the thickness. The marks 106 and 108 would move corresponding distances away from the center mark 104. After a cable cover 10 is made from a sheet 100 that has been so marked, it will slide over the outer surface of the device. The flanges 18 and 20 will still rest on and be supported by the same surface that supports the electronic device. This embodiment may facilitate the alignment of the rearmost edges of the cable covers, especially when only a small number of standard sized metal sheets are available for making the cable covers.

Figure 8:
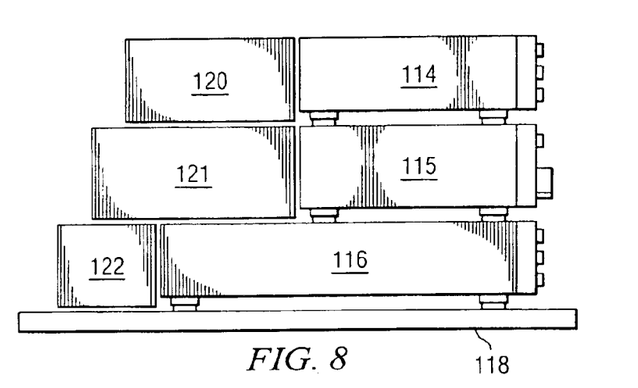
FIG. 8 is a side view of cable covers used with stacked devices to provide a uniformly staggered or stair step appearance.

In FIG. 3, multiple cable covers were used to provide the appearance that all the devices 34–38 had the same depth. Cable covers according to the present invention may be used to generate other appearances if desired. In FIG. 8, an electronic device 114 is shown supported on device 115, which is supported on device 116, which is supported on a single shelf 118. Devices 114 and 115 have the same depth, which is less than the depth of device 116. Cable covers 120, 121 and 122 are provided for devices 114–116. Cover 122 is supported directly on shelf 118 behind device 116 and extends to the greatest depth. Cover 121 is supported on device 116 and the cover 122, and provides an apparent depth of device 115 that is less than the apparent depth provided by cover 122. Cover 120 is supported by cover 121 and provides an apparent depth for device 114 that is less than the apparent depth of device 115. The covers 120–122 provide a uniformly staggered or stair step appearance of depths for the devices 114–116. The devices 114–116 themselves cannot provide this appearance, because devices 114 and 115 have the same depth dimensions. The covers 120–122 would also substantially block the view of and access to cables connected between the devices 114–116.

In the FIGS. 1 and 2 embodiment, the top 12 of the cable cover 10 is a simple rectangle. The rectangular shape is appropriate in many applications because electronic devices are normally of rectangular shape and are usually supported on a rectangular shelf. Other cable cover shapes may be used if desired. Some entertainment center cabinets are designed for room corner locations. The shelves are wider at the front and taper at a 45-degree angle toward the back. This shape can save considerable floor space and is well adapted for the shape of conventional televisions with picture tubes. However, the tapered shelves would limit the maximum depth of a cable cover 10.

Figure 9:
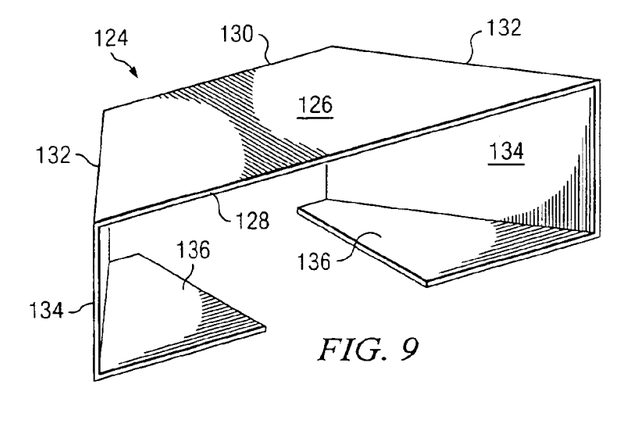
FIG. 9 is a perspective view of a cable cover according to another embodiment of the present invention.

FIG. 9 illustrates a cable cover 124 suitable for use in a corner entertainment center. The top 126 of cover 124 is flat and has parallel front and back edges 128 and 130. The side edges 132 of the top 126 are tapered or slanted at a 45-degree angle relative to the front and back edges 128, 130. Two sides 134 extend vertically down from the top 126 side edges 132 as in the other embodiments. However the sides 134 are slanted at the 45-degree angle. Bottom flanges may extend at right angles from bottom edges of the sides 134. This tapered cable cover may be made by bending a flat sheet as illustrated in FIGS. 5, 6 and 7, provided that the bending lines 106, 108 are slanted at 45 degrees and properly spaced. Some trimming of the sheet may be desirable. When the FIG. 9 embodiment is viewed from the side, it may provide an appearance similar to that shown in FIGS. 3 and 8.

Figure 10:
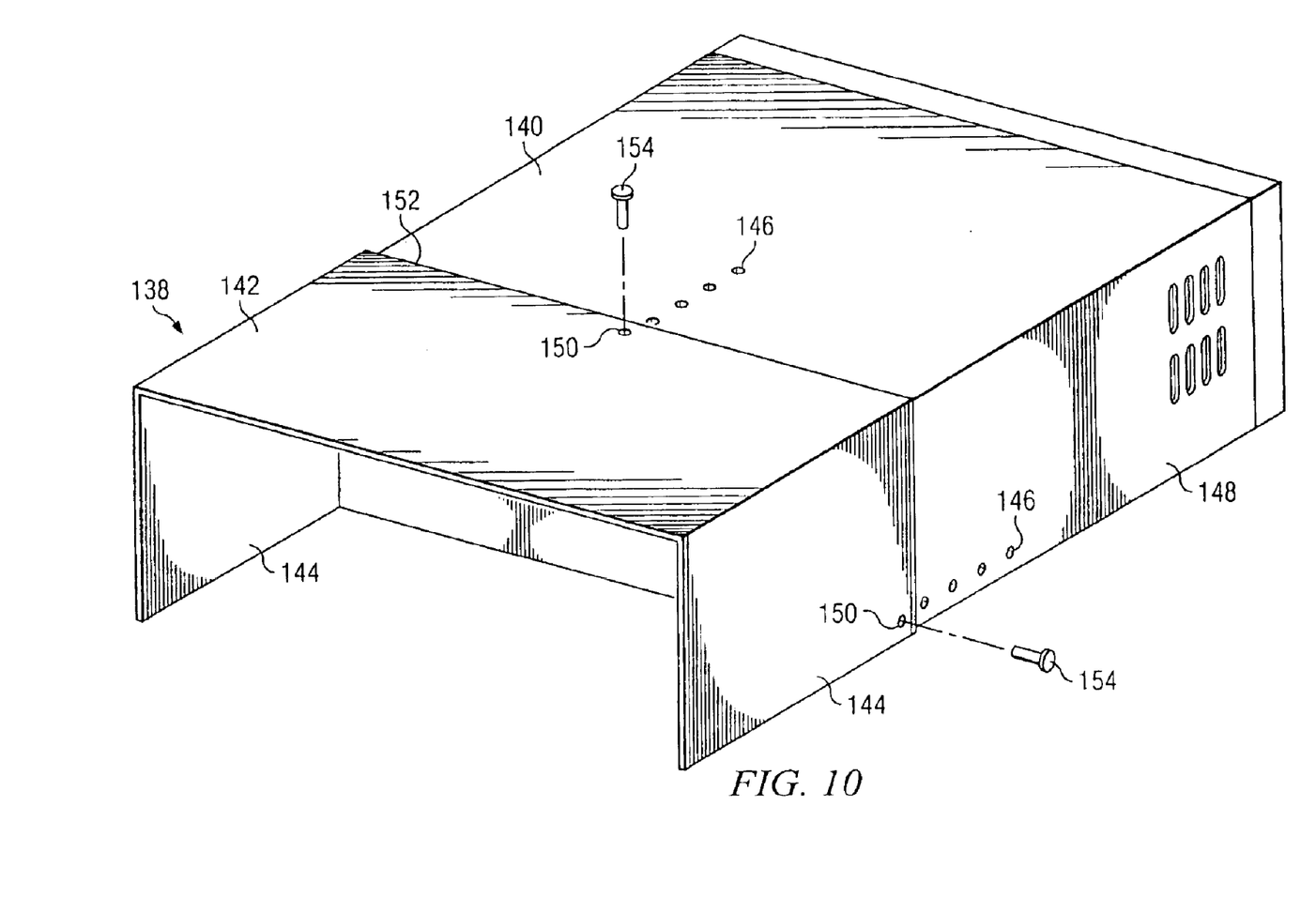
FIG. 10 is a perspective view of another embodiment of the present invention.

The flanges 18 and 20 shown in FIGS. 1 and 2, and the flanges 84 shown in FIG. 4 are not essential. FIG. 10 illustrates a cable cover 138 without flanges, attached to an electronic device 140. The cover 138 comprises only a rectangular top 142 and vertical sides 144. The spacing between sides 144 is selected to allow the cover 138 to slide over the device 140. A series of holes or perforations 146 are provided in the top and sides of outer housing 148 of the device 140. Three matching holes 150 are provided near the front edge 152 of the cover 138, one hole 150 near the bottom of each side 144 and one in the center of the top 142. A set of plastic pins 154 are shown in exploded view aligned for insertion into the holes 150 and into device housing holes 146 located under the cover holes 150. The cover 138 may be slid to any position in which the cover holes 150 line up with a set of the holes 146 and then releasably held in that position by insertion of the pins 154. This arrangement is convenient for a factory built and installed cable cover 138 that may be fully slid onto the device 140 and pinned into position for shipment to the ultimate customer. After the customer installs the device 140 in its entertainment center, the customer may remove the pins 146, slide the cover 138 back to a desired position and reinsert the pins 146 to hold the cover 138 in position. Fasteners other than plastic pins 154 in preformed holes 146 and 150 may be used to releasably hold the cover 138 in position relative to the device 140. For example magnetic strips, releasable adhesive strips or hook and loop fastener strips could be attached to the device 140 and cover 138. Many of these alternatives may be attached by the consumer and may be included in the do-it-yourself kits described above.

While the embodiments described herein are specifically applicable to devices having conventional rectangular shapes, it is apparent the wire cover embodiments for devices having other shapes may be made and used in accordance with the teachings of the present invention. Such embodiments would have a cross sectional shape corresponding to the shape of the back surface of an electronic device and would have a length dimension sufficient to cover wires and cables connected to the back of the electronic device. For example, if the back of the device had a semicircular shape, then a wire cover would be formed with a matching semicircular shape. When positioned adjacent the back of an electronic device, the cover would have the appearance of an extension of the device and would block the view of, and restrict access to, cables attached to the device.

While the present invention has been illustrated and described in terms of specific embodiments and methods of making and use, it is apparent that various substitutions of materials, parts and methods may be made within the scope of the present invention as defined by the appended claims.

What I claim as my invention is:

1. An apparatus for forming a chamber enclosed on five sides adjacent a back surface of an electronic device, the back surface having a height and width and having connections for cables, comprising:

a cover having a horizontal top and having vertical sides extending down from the top, the top and sides having front and back edges defining opposed front and back openings of the cover, the front opening having a height and width about equal to the height and width, respectively, of the electronic device back surface;

whereby when the electronic device is supported on a horizontal surface and the cover is positioned on and supported by the horizontal surface adjacent the electronic device back surface, the cover defines a chamber enclosed on the top and sides by at least part of the cover, enclosed on the front by the electronic device back surface and enclosed on the bottom at least in part by the horizontal surface; and     wherein the cover is not structurally attached to the electronic device.

2. The apparatus according to claim 1, wherein the cover back opening has a height and width about equal to the height and width, respectively, of the electronic device back surface.

3. The apparatus according to claim 1, wherein the cover back opening has a height about equal to the height or the electronic device back surface and has a width less than the width of the electronic device back surface.

4. An apparatus for forming a chamber enclosed on five sides adjacent a back surface of an electronic device, the back surface having a height and width and having connections for cables, comprising:
- a cover having a horizontal top and having vertical sides extending down from the top, the top and sides having front and back edges defining opposed front and back openings of the cover, the front opening having a height and width about equal to the height and width, respectively, of the electronic device back surface;
- whereby when the electronic device is supported on a horizontal surface and the cover is positioned on and supported by the horizontal surface adjacent electronic device back surface, the cover defines a chamber enclosed on the top and sides by at least part of the cover, enclosed on the front by the electronic device back surface and enclosed on the bottom at least in part by the horizontal surface;
- wherein the cover back opening has a height and width about equal to the height and width, respectively, of the electronic device back surface; and
- wherein the cover front and back openings have a height and width selected to telescopically slide over the back surface of the electronic device.

5. The apparatus according to claim 4, wherein when the electronic device is supported on a horizontal surface and the cover is positioned on the horizontal surface with a first portion of the cover telescopically positioned over the device and a second portion of the cover adjacent the electronic device back surface, the second portion of the cover defines a chamber enclosed on the top and sides by the second portion of the cover, enclosed on the front by the electronic device back surface and enclosed on the bottom at least in part by the horizontal surface.

6. An apparatus for forming a chamber enclosed on five sides adjacent a back surface of an electronic device, the back surface having a height and width and having connections for cables, comprising:
- a cover having a horizontal top and having vertical sides extending down from the top, the top and sides having front and back edges defining opposed front and back openings of the cover, the front opening having a height and width about equal to the height and width, respectively, of the electronic device back surface;
- whereby when the electronic device is supported on a horizontal surface and the cover is positioned on and supported by the horizontal surface adjacent the electronic device back surface, the cover defines a chamber enclosed on the top and sides by at least part of the cover, enclosed on the front by the electronic device back surface and enclosed on the bottom at least in part by the horizontal surface; and
- further comprising horizontal flanges extending from lower edges of the cover sides, said flanges enclosing a portion of the bottom of the chamber.

7. An apparatus adapted for use with an electronic device having a width and a height, comprising:
- a one piece cable cover having a horizontal top having a depth and a width, the width being about equal to the width of an electronic device, and having vertical sides extending down from the top and having a depth and height, the depth being about equal to the depth of the top and the height being about equal to the height of the electronic device;
- whereby when the cable cover is positioned adjacent an electronic device and the electronic device and cable cover are supported on the same generally flat surface, the cable cover encloses at least three sides of a rectangular space closed on five sides and a back surface of the electronic device encloses one side of the rectangular space.

8. The apparatus according to claim 7, wherein the cable cover comprises a single sheet of material comprising metal formed by bonding.

9. The apparatus according to claim 7, wherein the sides have upper and lower edges, the upper edge extending from the top, further comprising:
- horizontal flanges extending from the lower edges of the sides.

10. The apparatus according to claim 7, wherein the cover is not structurally attached to the electronic device.

11. An electronic device, comprising:
- a generally rectangular device housing having a top, bottom, front, back and two sides, and having connections for cables on the back,
- a one piece cable cover having a horizontal top having a depth and a width, the width being at least as great as the width of the top of the electronic device, and having vertical sides extending down from the top and having a height, the height being at least as great as the height of the electronic device, the cable cover operable to slide over the top and sides of the device housing and extendable from the back of the device housing to define a least three sides of a chamber behind the device where the back of the device housing defines a fourth side of the chamber.

12. The electronic device according to claim 11, wherein the cable cover sides have upper and lower edges, the upper edge extending from the top, further comprising:
- horizontal flanges extending from the lower edges of the sides under the bottom of the device housing.

13. The electronic device according to claim 12, wherein the horizontal flanges have a first edge extending from the lower edges of the sides and a second edge opposite the first edge, further comprising:
- vertical flanges extending upward from the second edges, and
- grooves in the bottom of the bottom of the device housing, the vertical flanges slidably engaging the grooves.

14. A method for covering cables connected to an electronic device, comprising:
- manually bending a sheet of material into a cover having a horizontal top surface having a width about equal to the width of an electronic device, and having two vertical sides extending downward from the top surface, the sides having a height about equal to the height of the electronic device;
- positioning the electronic device and the cover on a horizontal surface, with the cover positioned adjacent a back surface of the electronic device such that the cover defines at least three sides of a chamber behind the electronic device and the back surface of the electronic device defines a fourth side of the chamber.

15. The method of claim 14 wherein the material comprises a metal.

16. The method of claim 14 wherein the sheet of material is transported to the location of the device before bending.

17. The method of claim 14 wherein the cover is formed to have internal dimensions mating with external dimensions of the electronic device,
- the cover is slidably attached to the electronic device before the electronic device is transported to a customer premises, and the cover is positioned adjacent the electronic device by at least partially sliding the cover from the electronic device.

18. A method for covering cables connected to an electronic device, comprising:

manually bending a sheet of material into a cover having a cross sectional shape corresponding to the back surface of an electronic device and having a length dimension sufficient to cover wires and cables connected to the back of the electronic device, and positioning the electronic device and the cover on a horizontal surface, with the cover positioned adjacent a back surface of the electronic device such that the cover defines at least three sides of a chamber behind electronic device and the back surface of the electronic device defines a fourth side of the chamber.

19. The method of claim 18, wherein the material comprises a metal.

* * * * *

UNITED STATES PATENT AND TRADEMARK OFFICE
CERTIFICATE OF CORRECTION

PATENT NO. : 6,944,011 B2
DATED : September 13, 2005
INVENTOR(S) : Gary T. Krajecki It is certified that error appears in the above-identified patent and that said Letters Patent is hereby corrected as shown below:

Column 8,
Line 65, replace "or" with -- of --.

Column 10,
Line 8, replace "bonding" with -- bending --.

Column 12,
Line 4, insert -- the -- after "behind".

Signed and Sealed this

Eighth Day of November, 2005

JON W. DUDAS
*Director of the United States Patent and Trademark Office*